United States Patent [19]
Mogi et al.

[11] Patent Number: 4,706,186
[45] Date of Patent: Nov. 10, 1987

[54] INTEGRATED CIRCUIT DEVICES

[75] Inventors: Takao Mogi; Masahiko Morizono, both of Tokyo, Japan

[73] Assignee: Sony Corporation, Tokyo, Japan

[21] Appl. No.: 751,981

[22] Filed: Jun. 28, 1985

[30] Foreign Application Priority Data

Jul. 13, 1984 [JP] Japan .................................. 59-145657

[51] Int. Cl.[4] ...................... G05B 23/02; G06F 11/30; G06F 13/38
[52] U.S. Cl. .................................... 364/136; 364/135; 364/579; 371/20
[58] Field of Search ............... 364/579, 580, 134, 135, 364/136; 371/20, 23, 25

[56] References Cited

U.S. PATENT DOCUMENTS

| 4,044,244 | 8/1977 | Foreman et al. | 371/20 |
| 4,115,847 | 9/1978 | Osder et al. | 371/20 X |
| 4,155,116 | 5/1979 | Tawfik et al. | 371/20 X |
| 4,168,527 | 9/1979 | Winkler | 364/580 |
| 4,333,177 | 6/1982 | Sutterlin | 371/25 X |
| 4,389,710 | 6/1983 | Rasmussen | 371/25 X |

FOREIGN PATENT DOCUMENTS

EP51332 5/1982 European Pat. Off. .

Primary Examiner—Felix D. Gruber
Attorney, Agent, or Firm—Lewis H. Eslinger; Alvin Sinderbrand

[57] ABSTRACT

An integrated circuit device for an electronic equipment having an internal bus, the integrated circuit device comprising a digital-to-analog converter for converting a serial digital control signal to a corresponding analog control signal, a plurality of circuits subject to control in response to the analog control signal for performing specific functions, a switch circuit for selecting any one of the plurality of circuits, a switch control circuit for controlling the switch circuit to select any one of the plurality of circuits according to a received selection signal, an analog-to-digital converter for converting an output signal from the switch circuit into a corresponding digital signal, and a bus interface circuit for sending the serial digital control signal from the internal bus to the digital-to-analog converter and for sending the selection signal to the switch control circuit.

7 Claims, 7 Drawing Figures

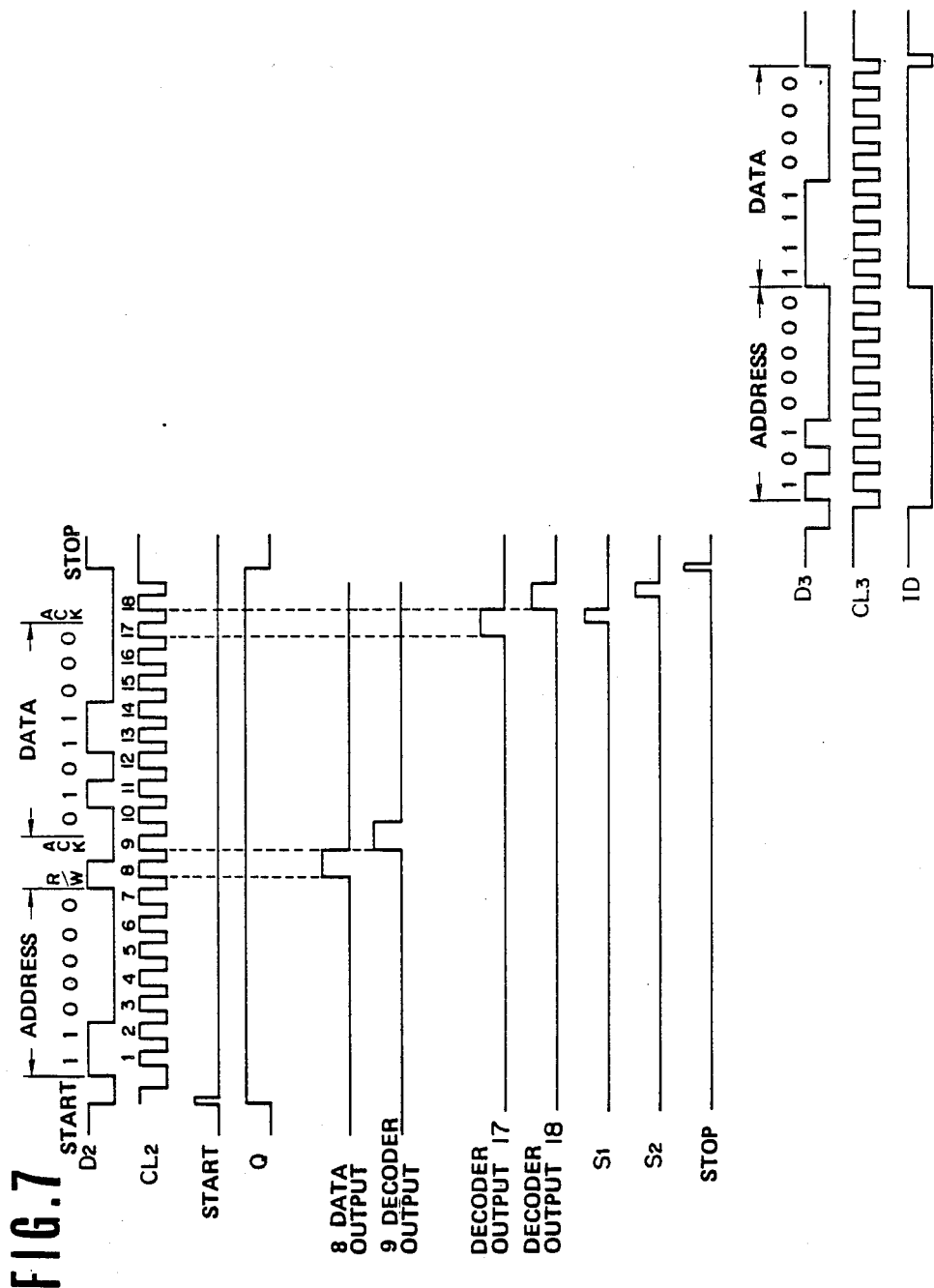

INTEGRATED CIRCUIT DEVICES

BACKGROUND OF THE INVENTION

Field of the Invention

This invention relates to integrated circuit (IC) devices. Embodiments of the invention are suitable for electronic equipment such as television receivers, video tape recorders (VTRs) and audio tape recorders, whose internal circuits are digitally controlled.

Description of the Prior Art

Video or audio equipment such as digital signal processing television receivers, VTRs and audio tape recorders have recently been commercialized. Most of such digital equipment uses internal bus lines common to a central processing unit (CPU), a memory, and other control circuitry. The CPU fetches control signal values for each circuit of the electronic equipment and stored in the memory, which may be a read only memory (ROM), during the normal operation and sends the fetched data to the appropriate circuit via the internal bus, which may comprise or include a so-called serial inter-integrated circuit (I2C) bus, so as to control the operation of the internal circuit. In addition, the CPU may control the circuits in the equipment in direct response to signals supplied manually through an external keyboard or a remote controller.

Such an internal bus is conventionally either of the two-wire or three-wire type. A two-wire internal bus comprises a data transmission line and a clock transmission line. The two-wire type bus may utilize the communication system disclosed in European Patent Application No. 81201168.2 (0 051 332). On the other hand, a three-wire bus comprises a data transmission line, a clock transmission line, and a so-called ident signal line used to identify the nature of each data block coming over the data transmission line.

If standardized, centralized and simplified testing of the internal circuitry during assembly and servicing of such electronic equipment in which internal bus lines are installed were possible, an overall cost reduction including a reduction in manufacturing cost could be achieved.

SUMMARY OF THE INVENTION

One object of the present invention is to provide an integrated circuit device for an electronic equipment having an internal bus system, and which is suitable for testing internal circuitry of the electronic equipment at the time of assembly or servicing.

According to the present invention there is provided an integrated circuit device for an electronic equipment having an internal bus, the integrated circuit device comprising:

a digital-to-analog converter for converting a serial digital control signal to a corresponding analog control signal;

a plurality of circuits subject to control in response to said analog control signal and for performing specific functions;

a switch circuit for selecting any one of said plurality of circuits;

a switch control circuit for controlling said switch circuit to select any one of said plurality of circuits according to a received selection signal;

an analog-to-digital converter for converting an output signal from said switch circuit into a corresponding digital signal; and a bus interface circuit for sending said serial digital control signal from said internal bus to said digital-to-analog converter and for sending said selection signal to said switch control circuit.

The use of an embodiment of the IC device according to the present invention for electronic equipment having an internal bus permits control of one or a plurality of circuits within the integrated circuit device by means, for example, of an external computer or remote controller. Therefore, the testing of the circuits in the IC device can easily be carried out at the time of assembly or servicing. It is usable in a case when circuit diagnosis is to be carried out. In addition, a plurality of such electronic equipments can be tested with a common computer or controller, so that a standardized and integrated test system can be achieved.

The above, and other objects, features and advantages of this invention will be apparent from the following detailed description of illustrative embodiments which is to be read in connection with the accompanying drawings.

BRIEF DESCRIPTION OF THE DRAWINGS

FIG. 7 is a timing chart illustrating the operation of the circuit shown in FIG. 6.

DESCRIPTION OF THE PREFERRED EMBODIMENTS

Figure 1:
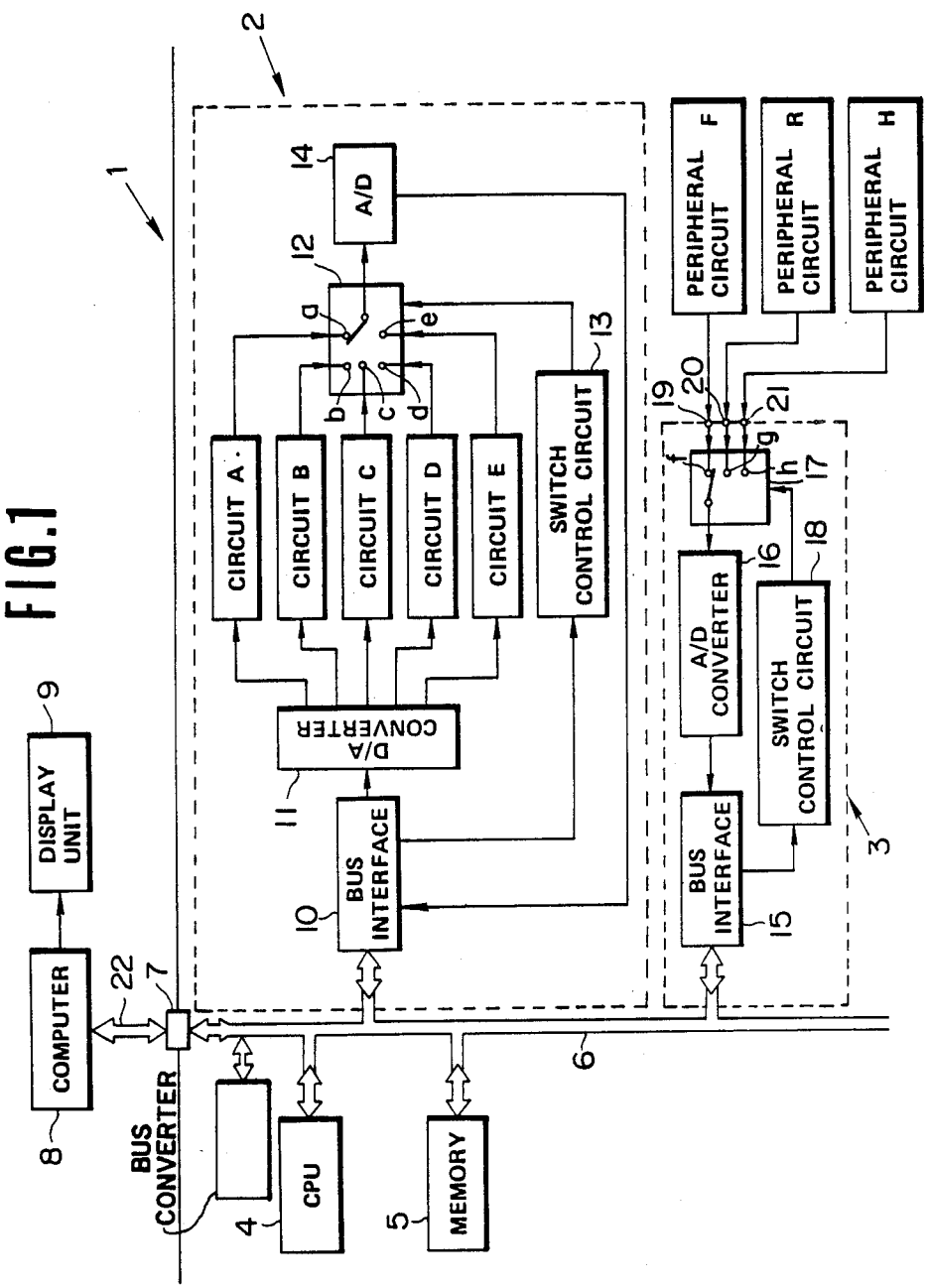
FIG. 1 is a simplified block diagram of an electronic equipment with which an embodiment of the present invention is being used.

In FIG. 1, a first integrated circuit (IC) device 2, a second IC device 3, a CPU 4, and a memory 5 are installed in the electronic equipment 1. The elements 2 to 5 are interconnected via a bus line 6. The bus line 6 ends at a connector 7 accessible from outside of the equipment 1. An external computer 8 for testing the equipment 1 is connected via another bus line 22 to the connector 7. The computer 8 is connected to a display unit 9, such as a cathode ray tube (CRT) monitor, for displaying test results.

The first IC device 2 comprises bus interface 10, a digital-to-analog (D/A) converter 11, analog circuits A to E, a switch circuit 12, a switch control circuit 13, and an analog-to-digital (A/D) converter 14. The bus interface 10 sends digital control signals received from the CPU 4 over the bus line 6 to the D/A converter 11 and the switch control circuit 13. The control signals identify both which of the circuits A to E is to be controlled and how the specified circuit A to E is to operate. The D/A converter 11 converts received signals to analog signals and directs the analog signals to the specified circuits A to E. The switch control circuit 13 connects the output terminal of the specified circuit A to E to the A/D converter 14 by driving the switch circuit 12 to a corresponding contact position a to e respectively. The A/D converter 14 then converts the analog output into a corresponding serial digital signal which is then returned to the bus line 6 via the bus interface 10. The circuits A to E are subject to control by the CPU 4, and to testing by the computer 8. In this embodiment, five different controlled circuits A to E are installed within the IC device 2.

The second IC device 3 comprises a bus interface 15, an A/D converter 16, a switch circuit 16, a switch control circuit 18, and input terminals 19, 20 and 21 for connecting the switch circuit 17 to external circuits. The bus interface 15 mentioned above is connected to the bus line 6. The input terminals 19, 20 and 21 are connected to the output terminals of three peripheral circuits F, G and H. The peripheral circuits F, G and H are discrete circuits rather than ICs and are controlled independently of the CPU 4. Input signals from the peripheral circuits F, G and H are selected by the switch circuit 17 and the switch control circuit 18 and then applied to the bus 6 via the A/D converter 16 and the bus interface 15.

The following paragraphs explain the operation of this arrangement during assembly of the equipment 1 and during maintenance. As will become clear, separate computers 8 will be used for testing during assembly and during service.

In the case of testing during assembly, a keyboard serving as a manual input device for the computer 8 is operated so as to generate digital data representing control signals. The data are sent into the first and second IC devices 2 and 3 via the bus line 22, the connector 7, and the bus line 6.

The data are latched via the bus interface 10 in the first IC device 2. The latched data are converted into corresponding analog control signals by the D/A converter 1 and sent to the circuits A to E. The circuits A to E are controlled by the associated control signals to supply signals characteristic of the operating states requested by the values of the control signals. The resulting output signals are converted into digital signals and returned to the computer 8 via the bus interface 10, and the bus lines 6 and 22. The display unit 9 displays the test results for the circuits A to E on the screen. These results can be compared by the operator with known design specifications, and, if necessary, the operator can adjust the input control signal via the keyboard so as to elicit the required output.

After confirming by way of the displayed images that the circuits A to E are operating correctly, the operator operates the keyboard so as to store the input control values for the circuits A to E in the memory 5 as reference values for use during normal operation. When the equipment 1 is operated, the CPU 4 reads the recorded reference values from the memory 5, and each circuit A to E performs the desired operation in response to the read data.

On the other hand, the peripheral circuits F, G and H must be controlled externally to produce changed output signals indicative of their state of operation. These output signals are received by the second IC device 3, that is, respective contacts f, g and h of the switch circuit 17, via the input terminals 19, 20 and 21.

The switch control circuit 18 selects sequentially or arbitrarily one of the contacts f, g and h on the basis of control signals from the computer 8. The selected input signals from the circuits F to H are converted into digital signals by the A/D converter 16 and sent to the computer 8 via the bus interface 15 and the bus lines 6 and 22. The display unit 9 then displays the test results for the peripheral circuit F, G and H on the screen.

In the case of fault diagnosis during service, a service-oriented computer 8 is connected to the bus line 22. The operator selects which of the circuits A to H is to be tested by entering an address specific to the selected circuit A to H through the keyboard. In response to this circuit selection, the computer 8 accesses the appropriate input control value stored in the memory 5 during assembly as described above, and supplies a control signal to the specified circuit, in the case of the circuits A to E, and to the switch control circuit 13 or 18. Thereafter, via the keyboard, the operator orders the computer 8 to sample the current output of the specified circuit via the bus lines 22 and 6. The computer 8 holds previously prepared output level patterns indicative of correct operation of the corresponding circuits A to H in an associated software package. The computer 8 compares the circuit output received over the bus line 22 with the corresponding stored level pattern in order to diagnose the state of the selected one of the circuits A to H. The results of the comparison are displayed on the display unit 9. If the above-described operation is carried out for all of the circuits A to H, the faulty circuit, if any, can be located.

Although in the embodiment shown a computer 8 is used to test the circuits A to H during assembly and service, a memory storing a test program and all requisite reference data may be incorporated into an equipment operable by remote control, and the memory 5 and circuits A to H may be accessed over the bus 6 in accordance with the above-described program by this special remote-control testing device.

Figure 2:
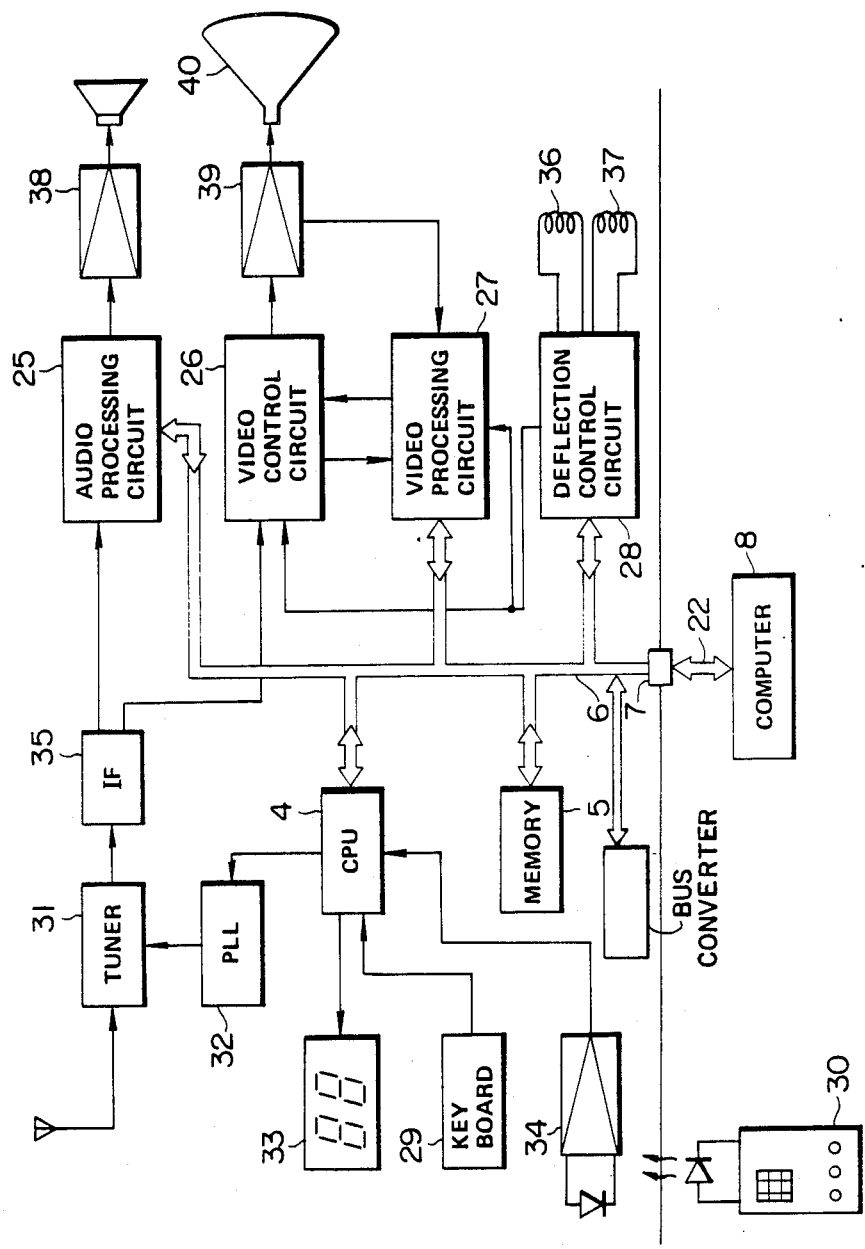
FIG. 2 is a simplified block diagram showing an embodiment of test arrangement according to the present invention in the case where a television receiver is to be tested.

FIG. 2 is a block circuit diagram of a television receiver having an internal bus, and to which the present invention is applicable. In FIG. 2 are shown the CPU 4, the memory 5, the bus lines 6 and 22 and the computer 8.

In the embodiment shown in FIG. 2, the controlled circuits A to E shown in FIG. 1 correspond to an audio processing circuit 25, a video control circuit 26, a video processing circuit 27, and a deflection control circuit 28. During normal operation the CPU 4 controls a phase-locked loop (PLL) circuit (32), which synchronizes each of the circuits 25 to 28, and a tuner 31 in accordance with instructions issued via a keyboard 29 or a remote controller 30. Manually selected values for frequency tuning, volume adjustment, picture adjustment and the like may be displayed on a display unit 33. There is also shown a remote control signal receiver 34, an intermediate frequency amplifier 35, deflection coils 36 and 37 for a CRT 40, an audio power amplifier 38, a video power amplifier 39, and the CRT 40.

The computer 8 or the remote controller 30 may be used for testing and adjustment during assembly or service, such as were described with reference to FIG. 1. Operating factors which may require adjustment include, for example, electron beam parameters such as linearity, width, pin-cushion distortion in both horizontal and vertical directions, colour adjustments such as white balance, the cut-off points and drive of R (red), G (green) and B (blue) signals, and grid bias adjustments for the CRT 40.

In addition, various data obtained from tests during service can be recorded in the memory 5, or on an external recording medium, or alternatively may be sent to a centralized collective control computer via telephone lines. The central computer can then prepare documents on the basis of data from every service station and can distribute these documents to design, development, manufacturing, materials and service departments.

Figure 3:
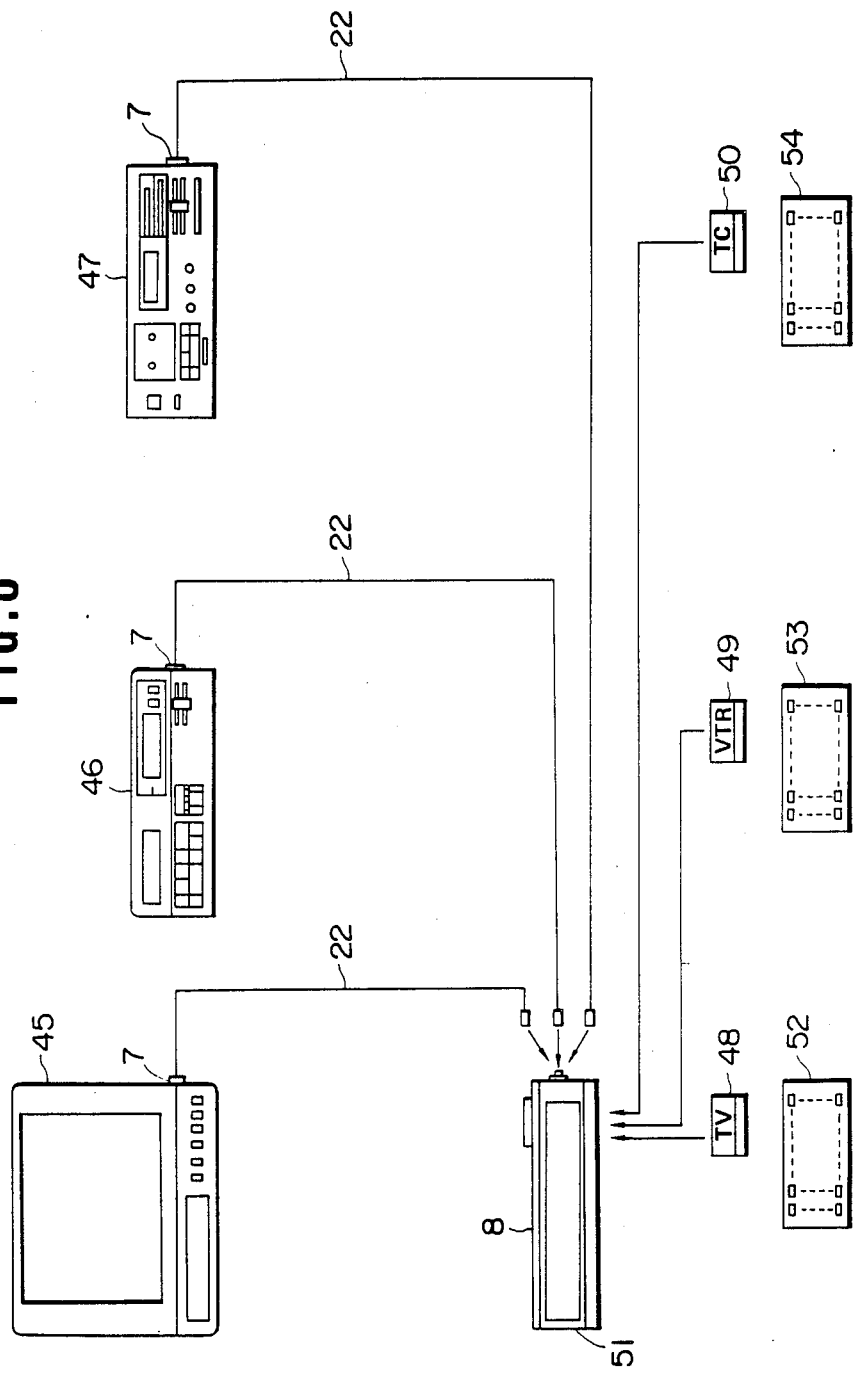
FIG. 3 is a simplified circuit diagram of another embodiment of test arrangement according to the present invention and suitable for testing various kinds of electronic equipment.

FIG. 3 shows a configuration to which the present invention is applicable and in which a television receiver 45, a VTR 46 and an audio tape recorder 47, each having an internal bus line 6 as shown in FIG. 1, are connected in common to the computer 8 for testing and possible adjustment. In this case, a commerically available personal computer is used as the computer 8. A television test cartridge 48, a video test cartridge 49, and/or a tape recorder test cartridge 50 may be selectively connected to the computer 8 depending on the respective equipment 45, 46 or 47 to be tested. Each of the cartridges 48, 49 and 50 contains a data-storage medium such as a magnetic tape, a floppy disc or a ROM holding a set of programs and data stores specific to and sufficient for testing and adjustment of the corresponding equipment. In addition, device-specific keyboard overlays 52, 53, and 54 may be prepared for the keyboard of the computer 8. The computer 8 is connected to the bus lines 6 (not shown in FIG. 3) of each of the equipments via the respective bus lines 22 and connectors 7.

Since in this embodiment the common computer 8 can be used to test a plurality of different electronic equipments just by replacing the software according to the kind of equipment, testing and adjustment operations as well as test-related computer hardware and interconnections can be fully standardized.

Having described the test operations, conversion of data between a two-wire bus protocol and a three-wire bus protocol will be described. Recently, two-wire and three-wire serial bus lines have most commonly been used for internal bus lines as described above.

Figure 4:
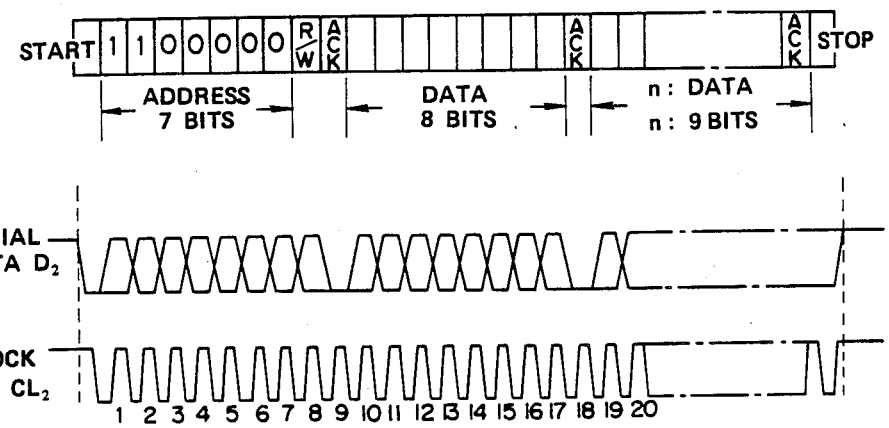
FIG. 4 illustrates a two-wire serial bus protocol.

FIG. 4 shows the data-packet format for signals transmitted over a two-wire bus line. A first transmission line of the two-wire bus line transmits serial data (bit serial) $D_2$ and a second transmission line thereof transmits a clock signal $CL_2$. Each data packet comprises:

(a) a first bit signal indicating the start of the data packet;

(b) a seven-bit address signal specifying an address assigned to a controlled circuit;

(c) a one-bit read/write (R/W) signal indicating whether the following data is to be sent to the specified controlled circuit or fetched from the specified controlled circuit;

(d) a one-bit acknowledge (ACK) signal informing the computer that the specified controlled circuit has received the data;

(e) eight bits of data representing the adjustment value;

(f) n subsequent packets of data as required, each of eight bits plus a one-bit ACK signal; and (g) a one-bit stop signal.

Figure 5:
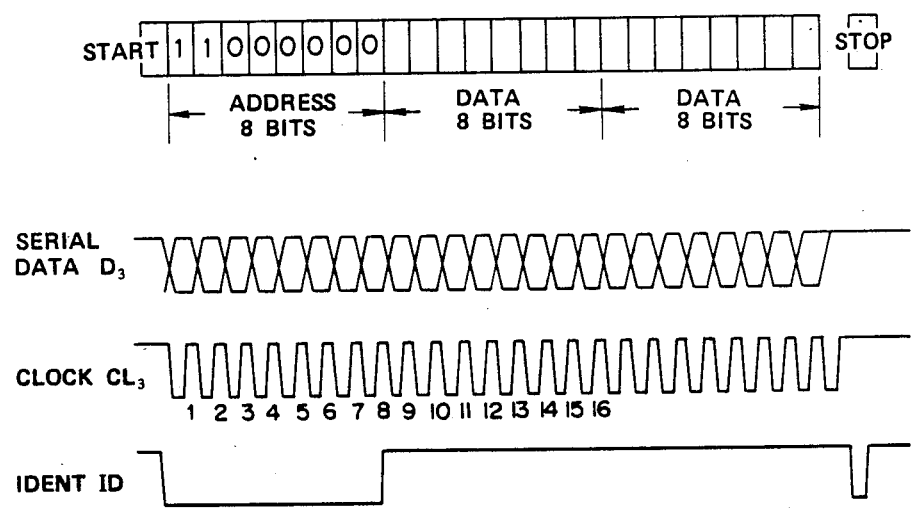
FIG. 5 illustrates a three-wire serial bus protocol.

FIG. 5 shows a format of a signal to be transmitted via the three-wire bus line.

A first transmission line thereof transmits serial data $D_3$, a second transmission line transmits a clock signal $CL_3$, and a third transmission line transmits an ident signal ID identifying the type of information, address or data, currently encoded in the serial data $D_3$.

Each data packet starts with a one-bit start signal which drives the ident signal ID to low level to indicate that the following eight bits of data on the line $D_3$ represent an address. The eight-bit address is followed directly by two eight-bits bytes of data. The ident signal ID is at high level throughout transmission of these latter sixteen bits of data, then goes to low level again briefly before returning finally to the high level in response to a stop bit over line $D_3$, which indicates the end of the data packet.

Figure 6:
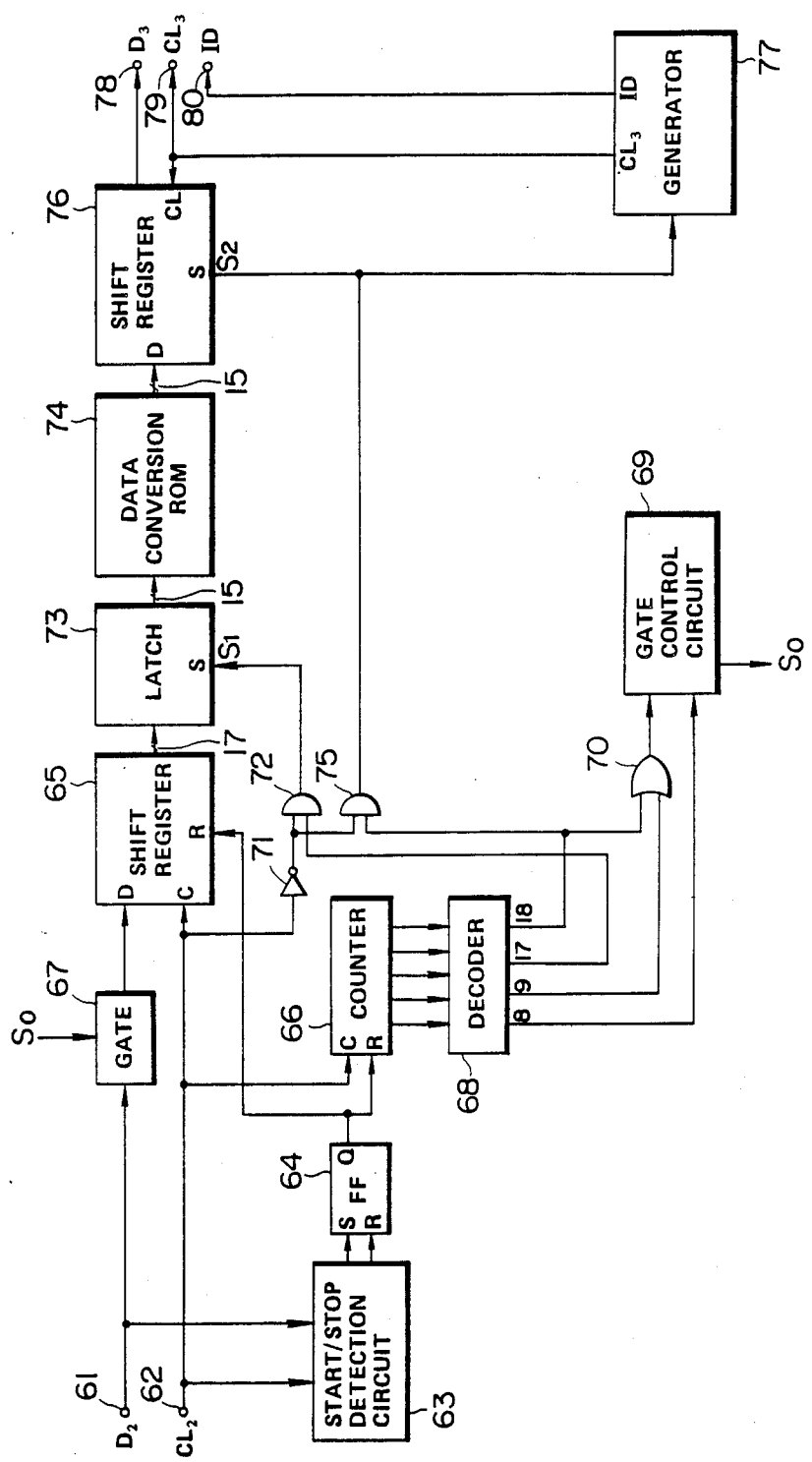
FIG. 6 is a simplified block diagram of one example of a bus converter.

FIG. 6 shows a preferred example of a bus converter for converting signals transmitted over a two-wire bus line to signals compatible with the three-wire bus protocol. FIG. 7 is a timing chart for the bus converter shown in FIG. 6.

In FIGS. 6 and 7, the line for the serial data $D_2$ is connected to an input terminal 61, and the line for the clock line $CL_2$ shown in FIG. 4 is connected to another input terminal 62. First, when the one-bit start signal in the data $D_2$ is detected by a start/stop detection circuit 63, the output Q of a flip-flop (F/F) circuit 64 rises to high level. The reset terminals (R) of a shift register 65 and a counter 66 are connected to the Q output of the flip-flop circuit 64 and so are reset in response to the rising edge of the Q output. When these circuits 65 and 66 are reset, the shift register 65 starts reading the received serial data $D_2$ via a gate 67 at its data terminal D in synchronization with the clock signal $CL_2$, and simultaneously the counter 66 starts counting the clock pulses of the clock signal $CL_2$. A decoder 68 receives a five-bit-wide parallel count value from the counter 66 and supplies pulses indicative of important bit-count positions in the packet of data $D_2$, specifically the 8th, 9th, 17th and 18th bit position pulses corresponding to the R/W bit, first ACK bit, second ACK bit and stop bit respectively. These four output lines are connected to various logic circuits in the bus converter. In particular, a gate control circuit 69 receives the 8th bit position pulse directly and the 9th and 18th bit position pulses via a common OR gate 70. The control circuit 69 produces a gating signal So which renders the gate 67 conductive in response to the 9th or 18th bit position pulses and non-conductive in response to the 8th bit position pulse. This serves to screen the R/W and first ACK bits out of the packet of data $D_2$, as will become clear later.

The 17th bit position pulse from the decoder 68 is sent to an AND gate 72, which also receives inverted clock pulses $\overline{CL_2}$ from an inverter 71 connected to the clock terminal C of the shift register 65. The ANDed output signal is sent to the set terminal of a latch 73 as a set signal $S_1$. In response to this set signal the latch 73 latches the fifteen meaningful bits of serial data, that is the 7-bit address and the eight bits of data held in the shift register 65. These fifteen bits are then converted to 16-bit format for the three-wire bus line by means of a data-conversion ROM 74.

The 18th bit position pulse from the decoder 68 is also applied to another AND gate 75, which also receives the inverted clock pulses $\overline{CL_2}$ from the inverter 71. The ANDed output signal from the AND gate 75 is sent to the set terminals S of another shift register 76, and of a clock signal $CL_3$ and ident signal (ID) generator 77, as a set signal $S_2$. The shift register 76 fetches the converted data from the ROM 74 in response to the set signal $S_2$.

When the start-stop detection circuit 63 detects the stop signal, the Q output of the flip-flop circuit 64 falls to the low level. The signal generator 77 generates clock pulses $CL_3$ and an ident signal ID for the three-wire bus line. The clock pulses $CL_3$ are supplied from an output terminal 79 at a desired frequency and are used sequentially to read the contents of the shift register 76. The ident signal ID is supplied via another output terminal 80 connected directly to the signal generator 77. Finally, the contents of the shift register 76, that is, eight bits of address and eight bits of data are serially supplied via another output terminal 78.

In addition to the above-described example of a bus converter for converting the data format from the two-wire system to the three-wire system, other bus converters for converting the data format from the two-wire system to the three-wire system may alternatively be used. It should be noted that both the bus line 22 connected to the external computer 8 and the internal bus line 6 of each of the electronic equipments must be either a two-wire system or a three-wire system. In addition, a signal generator for the two-wire system shown in FIG. 4 and a signal generator for the three-wire system shown in FIG. 5 may be disposed between the computer 8 and the electronic equipment for use as needed. A more powerful computer may alternatively be used selectively to provide a two-wire or three-wire or other system of signals. A signal converter designed for two-wire/three-wire conversion may be used instead. The above-described bus converters may be installed within the electronic equipment.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit device for an electronic equipment having an internal bus of a first bus format and adapted for control by a computer having a second bus format, the integrated circuit device comprising:
   a bus converter receiving control signals from said computer in said second bus format and generating control signals including a serial digital control signal in said first bus format and placing said control signals on said internal bus;
   a digital-to-analog converter for converting said series digital control signal to a corresponding analog control signal;
   a plurality of circuits, a first number of which are subject to control in response to said analog control signal, a second number of which operate independently of said computer, and all said circuits for performing specific functions;
   a switch circuit for selecting any one of said plurality of circuits;
   a switch control circuit for controlling said switch circuit to select any one of said plurality of circuits according to a received selection signal;
   an analog-to-digital converter for converting an output signal from said switch circuit into a corresponding digital signal; and
   a bus interface circuit for sending said serial digital control signal from said internal bus to said digital-to-analog converter and for sending said selection signal to said switch control circuit.

2. An integrated circuit device according to claim 1 wherein said switch circuit is connected between respective outputs of said plurality of circuits and said analog-to-digital converter for selecting an output signal from any one of said plurality of circuits in dependence on an output signal from said switch control circuit.

3. An integraged circuit device according to claim 1 wherein said computer is connected to said internal bus by said bus converter for testing the specific functions of said plurality of circuits via said bus interface circuit.

4. A integrated circuit device according to claim 1 incorporated in an electronic equipment in which said computer is connected to said internal bus by said bus converter for testing the specific functions of said plurality of circuits via said bus interface circuit.

5. An integrated circuit device according to claim 1 wherein said first bus format is a three-wire format including a first clock signal and said second bus format is a two-wire format including a second clock signal and said bus converter comprises:
   a start/stop detector receiving said control signals;
   register means enabled by said start/stop detector for reading said serial digital control signal from said computer;
   a decoder means responsive to said start/stop detector for indicating predetermined bit-positions in said digital control signal from said computer and producing corresponding bit-position output signals;
   a data conversion read only memory connected to said register means for converting said digital control signal to said second bus format;
   logic circuit means connected to said decoder and said digital control signal from said computer to generate a set signal;
   clock generator means responsive to said set signal for generating said second clock signal and an identification signal; and
   a shift register receiving the converted digital control signal from said data conversion read only memory and responsive to said set signal and said second clock signal to read out said converted a serial digital signal in said first bus format along with said identification signal and said predetermined clock signal.

6. An integrated circuit device according to claim 5 wherein said register means comprises a second shift register and a latch circuit, said second shift register being connected to be reset by said start/stop detection circuit and connected to said digital control signal and said first clock signal in said first format for producing parallel output signals fed to said latch circuit having outputs connected to said data conversion read only memory.

7. An integrated circuit device according to claim 6 wherein said logic circuit elements also generate a second set signal for controlling operation of said latch circuit.

* * * * *